(12) United States Patent  
Slota et al.

(10) Patent No.: US 7,660,682 B2  
(45) Date of Patent: **\*Feb. 9, 2010**

(54) SYSTEM AND METHOD FOR COMPENSATING FOR POTENTIAL AND CURRENT TRANSFORMERS IN ENERGY METERS

(75) Inventors: Frederick B. Slota, Lake Ronkonkoma, NY (US); Andrew J. Werner, Wading River, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/998,736

(22) Filed: Nov. 30, 2007

(65) Prior Publication Data

US 2008/0125986 A1 May 29, 2008

Related U.S. Application Data

(63) Continuation of application No. 11/109,351, filed on Apr. 18, 2005, now Pat. No. 7,305,310.

(60) Provisional application No. 60/619,909, filed on Oct. 18, 2004.

(51) Int. Cl.
*G01R 22/00* (2006.01)
*G06F 17/40* (2006.01)

(52) U.S. Cl. ............... 702/57; 702/61; 702/60; 702/64; 324/601; 324/130; 324/141

(58) Field of Classification Search ............ 702/57, 702/60, 61, 62, 64, 65
See application file for complete search history.

(56) References Cited

U.S. PATENT DOCUMENTS

| 2,900,605 A | 8/1959 | Squires et al. |
| 2,992,365 A | 7/1961 | Brill |
| 3,084,863 A | 4/1963 | Du Vall |

(Continued)

FOREIGN PATENT DOCUMENTS

WO     WO 98/54583     12/1998

(Continued)

OTHER PUBLICATIONS

Manual, "3300 ACM, Economical Digital Power Meter/Transducer—Installation and Operation Manual, Power Measurement, Ltd.", 1999, pp. 79.

(Continued)

*Primary Examiner*—Hal D Wachsman
(74) *Attorney, Agent, or Firm*—Gerald E. Hespos; Anthony J. Casella; Michael J. Porco

(57) ABSTRACT

A meter device for measuring electrical energy is provided. The meter device includes circuitry for measuring at least one parameter of electrical energy provided to the meter device. A storage device is provided for storing at least one calibration factor for compensating for errors associated with at least one of at least one external current transformer (CT) and at least one external potential transformer (PT) that operates on the electrical energy provided to the meter device. At least one processor is provided for processing the at least one calibration factor for adjusting the measuring for compensating for the errors when measuring the at least one parameter of electrical energy.

14 Claims, 4 Drawing Sheets

U.S. PATENT DOCUMENTS

| | | | |
|---|---|---|---|
| 3,205,439 A | 9/1965 | Sangi et al. | |
| 3,458,810 A | 7/1969 | Wald | |
| 4,066,960 A | 1/1978 | Milkovic | |
| 4,077,061 A | 2/1978 | Johnston et al. | |
| 4,182,983 A | 1/1980 | Heinrich et al. | |
| 4,240,149 A | 12/1980 | Fletcher et al. | |
| 4,283,772 A | 8/1981 | Johnston | |
| 4,345,311 A | 8/1982 | Fielden | |
| 4,360,879 A | 11/1982 | Cameron | |
| 4,437,059 A | 3/1984 | Hauptmann | |
| 4,442,492 A | 4/1984 | Karlsson et al. | |
| 4,463,311 A | 7/1984 | Kobayashi | |
| 4,486,707 A | 12/1984 | Randall et al. | |
| 4,608,533 A | 8/1986 | Starkie | |
| 4,713,608 A | 12/1987 | Catiller et al. | |
| 4,713,609 A | 12/1987 | Losapio et al. | |
| 4,742,296 A | 5/1988 | Petr et al. | |
| 4,799,008 A | 1/1989 | Kannari | |
| 4,839,819 A | 6/1989 | Begin et al. | |
| 4,843,311 A | 6/1989 | Rozman et al. | |
| 4,902,965 A | 2/1990 | Bodrug et al. | |
| 4,933,633 A | 6/1990 | Allgood | |
| 4,949,029 A | 8/1990 | Cooper et al. | |
| 4,958,294 A | 9/1990 | Herscher et al. | |
| 4,989,155 A | 1/1991 | Begin et al. | |
| 4,999,572 A | 3/1991 | Bickford et al. | |
| 5,014,229 A | 5/1991 | Mofachern | |
| 5,017,860 A | 5/1991 | Germer et al. | |
| 5,079,715 A | 1/1992 | Venkataraman et al. | |
| 5,122,735 A | 6/1992 | Porter et al. | |
| 5,132,609 A | 7/1992 | Nguyen | |
| 5,132,610 A | 7/1992 | Ying-Chang | |
| 5,170,115 A | 12/1992 | Kashiwabara et al. | |
| 5,212,441 A | 5/1993 | McEachern et al. | |
| 5,229,713 A | 7/1993 | Bullock et al. | |
| 5,243,536 A | 9/1993 | Bradford | |
| 5,245,275 A | 9/1993 | Germer et al. | |
| 5,248,935 A | 9/1993 | Sakoyama et al. | |
| 5,248,967 A | 9/1993 | Daneshfar | |
| 5,258,704 A | 11/1993 | Germer et al. | |
| 5,289,115 A | 2/1994 | Germer et al. | |
| 5,298,854 A | 3/1994 | McEachern et al. | |
| 5,298,855 A | 3/1994 | McEachern et al. | |
| 5,298,856 A | 3/1994 | McEachern et al. | |
| 5,301,121 A | 4/1994 | Garverick et al. | |
| 5,302,890 A | 4/1994 | McEachern et al. | |
| 5,343,143 A | 8/1994 | Voisine et al. | |
| 5,391,983 A | 2/1995 | Lusignan et al. | |
| 5,406,495 A | 4/1995 | Hill | |
| 5,442,279 A | 8/1995 | Kitayoshi et al. | |
| 5,459,459 A | 10/1995 | Lee, Jr. | |
| 5,528,507 A | 6/1996 | McNamara et al. | |
| 5,548,527 A | 8/1996 | Hemminger et al. | |
| 5,555,508 A | 9/1996 | Munday et al. | |
| 5,563,506 A * | 10/1996 | Fielden et al. | 324/142 |
| 5,619,142 A | 4/1997 | Schweer et al. | |
| 5,627,759 A | 5/1997 | Bearden et al. | |
| 5,642,300 A | 6/1997 | Gubisch et al. | |
| 5,650,936 A | 7/1997 | Loucks et al. | |
| 5,706,214 A | 1/1998 | Putt et al. | |
| 5,734,571 A | 3/1998 | Pilz et al. | |
| 5,736,847 A | 4/1998 | Van Doorn et al. | |
| 5,737,231 A | 4/1998 | Pyle et al. | |
| 5,828,576 A | 10/1998 | Loucks et al. | |
| 5,862,391 A | 1/1999 | Salas et al. | |
| 5,897,607 A | 4/1999 | Jenney et al. | |
| 5,933,029 A | 8/1999 | Kuroda et al. | |
| 5,963,734 A | 10/1999 | Ackerman et al. | |
| 5,994,892 A | 11/1999 | Turino et al. | |
| 5,995,911 A | 11/1999 | Hart | |
| 6,023,160 A | 2/2000 | Coburn | |
| 6,064,192 A | 5/2000 | Redmyer | |
| 6,185,508 B1 | 2/2001 | Van Doorn et al. | |
| 6,262,672 B1 | 7/2001 | Brooksby et al. | |
| 6,374,084 B1 | 4/2002 | Fok | |
| 6,401,054 B1 | 6/2002 | Andersen | |
| 6,429,637 B1 * | 8/2002 | Gandhi | 324/74 |
| 6,590,380 B2 | 7/2003 | Edel | |
| 6,671,635 B1 | 12/2003 | Forth et al. | |
| 6,694,270 B2 | 2/2004 | Hart | |
| 6,714,881 B2 | 3/2004 | Carlson et al. | |
| 6,735,535 B1 * | 5/2004 | Kagan et al. | 702/61 |
| 6,759,837 B2 * | 7/2004 | Gandhi | 324/74 |
| 6,988,043 B1 | 1/2006 | Randall | |
| 7,174,261 B2 | 2/2007 | Gunn et al. | |
| 7,191,076 B2 | 3/2007 | Huber et al. | |
| 7,305,310 B2 * | 12/2007 | Slota et al. | 702/57 |
| 7,359,809 B2 * | 4/2008 | Bruno | 702/64 |
| 2002/0180420 A1 * | 12/2002 | Lavoie et al. | 324/142 |
| 2003/0178985 A1 | 9/2003 | Briese et al. | |
| 2004/0183522 A1 | 9/2004 | Gunn et al. | |
| 2005/0071106 A1 | 3/2005 | Huber et al. | |
| 2005/0240362 A1 * | 10/2005 | Randall | 702/61 |
| 2005/0288876 A1 | 12/2005 | Doig et al. | |
| 2006/0095219 A1 | 5/2006 | Bruno | |

FOREIGN PATENT DOCUMENTS

| | | |
|---|---|---|
| WO | WO 01/55733 | 8/2001 |

OTHER PUBLICATIONS

Brochure, Sentinel TM Electronic "Multimeasurement Meter," Schlumberger, Mar. 2001, 4 pages.

7700 Ion 3-Phase Power Meter, Analyzer and Controller, pp. 1-8, Nov. 30, 2000.

6200 ION, Installation & Basic Setup Instructions, (c)Power Measurement Ltd., Revision Date Apr. 25, 2001, 50 pages.

ION(R) Technology, Meter Shop User's Guide, (c)Power Measurement Ltd., Revision Date May 10, 2001, 48 pages.

Electro Industries/Gauge Tech DM Series—specification brochure, "DMMS 425 Low-Cost Multifunction Power Monitoring Outperforms All Others in its Class", 4 pages.

User' Installation & Operation and User's Programming Manual, The Futura Series, Electro Industries, pp. 1-64, (c)1995.

Nexus 1250 Installation and Operation Manual Revision 1.20, Electro Industries/Gauge Tech, 50 pages, Nov. 8, 2000.

8400 ION/8500 ION Instruction Leaflet, Power Measurement, pp. 1-8, Oct. 1999.

Nexus 1250, Precision Power Meter & Data Acquisition Node, Accumeasure(r) Technology, Electro Industries/Gauge Tech, specification, 16 pages, Nov. 1999.

3720 ACM, 3-hase Power Instruction Package, Power Measurement, specification, 8 pages, revision date Dec. 16, 1998.

3720 ACM, Installation & Operation Manual, Power Measurement, 67 pages, revision date Apr. 4, 2000.

ION Technology, 7500 ION High Visibility 3-Phase Energy & Power Quality Meter, Power Measurement, specification, pp. 1-8, revision date Mar. 21, 2000.

ION Technology 7700 ION 3-Phase Power Meter, Analyzer and Controller, Power Measurement, specification, pp. 1-10, revision date Dec. 8, 1998.

ION Technoogy 7700 ION Installation & Operation Manual, Power Measurement, revision date Nov. 20, 1996.

8500 ION Technical Documentation, 8500 ION and 8500 ION-PQ Advanced Intelligent Billing Meters, specification, Power Measurement, revision date Apr. 15, 1999.

ION Technology 8500 ION Advanced Socket-Mount Meter, specification, Power Measurement, pp. 1-12, revision date Dec. 3, 1999.

ION Technology 7500 ION 7600 ION High Visibility Energy and Power Quality Compliance Meters, specification, Power Measurement, pp. 1-8, revision date Nov. 30, 2000.

Ramboz, J.D. and Petersons, O., NIST Measurement Services: A Calibration Service for Current Transformers, U.S. Dept. of Commerce, National Institute of Standards and Technolo.

Performance Power Meter & Data Acquisition Node, Electro Industries/Gauge Tech, Nexus 1250 specification, 8 pages, Dec. 14, 2000.

Nagura et al., "Correction method for a single chip power meter", May 10-12, 1994, IEEE, 1994 IEEE Instrumentation and Measurement Technology Conference, 1994. ITMC/94.

http://www.landisgyr.us/Landis_Gyr/Meters/2510_socket_meter.asp, Apr. 18, 2005, 25 pages.

ION 7550 ION 7650 User Guide Power Measurement—Revision Date Aug. 31, 2004.

* cited by examiner

| VOLTAGE COMPENSATION | COMPENSATION |
|---|---|
| PHASE A | |
| PHASE B | |
| PHASE C | |
| AUXILIARY** | |

** NOT REQUIRED FOR POWER OR ENERGY CORRECTION

FIG. 2A

POWER AT UNITY

| CURRENT (A) | PHASE A COMPENSATION | PHASE B COMPENSATION | PHASE C COMPENSATION | *NEUTRAL(MEASURED) COMPENSATION |
|---|---|---|---|---|
| 5 | | | | |
| 2.5 | | | | |
| 1 | | | | |
| 0.5 | | | | |
| 0.25 | | | | |
| 0.15 | | | | |

FIG. 2B

POWER AT 60° PHASE SHIFT (LAG)

| CURRENT (A) | PHASE A COMPENSATION | PHASE B COMPENSATION | PHASE C COMPENSATION |
|---|---|---|---|
| 10 | | | |
| 5 | | | |
| 2.5 | | | |
| 1 | | | |
| 0.5 | | | |

FIG. 2C

SYSTEM AND METHOD FOR COMPENSATING FOR POTENTIAL AND CURRENT TRANSFORMERS IN ENERGY METERS

This application is a continuation application of an application filed on Apr. 18, 2005, assigned U.S. application Ser. No. 11/109,351, now U.S. Pat. No. 7,305,310, entitled "System and Method for Compensating for Potential and Current Transformers in Energy Meters", and which claims priority under 35 U.S.C. §119 to U.S. Provisional Application Ser. No. 60/619,909, filed on Oct. 18, 2004, and entitled "Potential Transformer and Current Transformer Calibration for Revenue Meters", the entire contents of both applications are expressly incorporated herein in their entirety.

BACKGROUND OF THE INVENTION

1. Field of the Invention

This invention relates to meters for measuring energy. In particular, this invention relates to a system and method for compensating for potential and current transformers in meters for measuring energy.

2. Description of the Related Art

Electrical utility companies ("utilities") track electric usage by customers by using power meters. These meters track the amount of power consumed at a particular location, such as a substation. The electric utility companies may use the power meter to charge its customers for their power consumption, i.e., revenue metering.

Traditionally, power meters used mechanical means to track the amount of consumed power. The inductive spinning disk power meter is still commonly used. The spinning disk drives mechanical counters that track the power consumption information.

Newer to the market are electronic power meters. Electronic meters have replaced the older mechanical meters, and utilize digital sampling of the voltage and current waveforms to generate power consumption information. In both, the mechanical and electronic power meters, when used with high voltages and currents, such as at a substation setting, the meters incorporate external sensors to divide the voltage and current into levels that are safe for the meters to read. Typically, a primary voltage is divided to a secondary 120 volt waveform, and a primary current is divided to a 5 amp secondary waveform. The sensors are current and/or voltage (potential) transformers, which introduce errors into the measurements in addition to errors introduced by other sources, such as the meters themselves. Furthermore, errors introduced by the current transformers are nonlinear throughout the range of magnitude of usage. Additionally, the current transformers are inductive by nature, and generate a phase shift which further degrades accuracy in measurements.

Therefore, it is an aspect of the invention to compensate for errors introduced by current and/or voltage transformers into readings by power meters.

It is further an aspect of the invention to compensate for nonlinear errors introduced by current transformers into readings by power meters.

Additionally, it is an aspect of the invention to compensate for errors introduced into readings by power meters due to phase shifts generated by the current transformers.

SUMMARY OF THE INVENTION

A meter device for measuring electrical energy is provided. The meter device includes circuitry for measuring at least one parameter of electrical energy provided to the meter device and a storage device for storing at least one calibration factor for compensating for errors associated with at least one of at least one external current transformer (CT) and at least one external potential transformer (PT) that operates on the electrical energy provided to the meter device. The meter device further includes at least one processor for processing the at least one calibration factor for adjusting the measuring for compensating for the errors when measuring the at least one parameter of electrical energy.

Pursuant to another embodiment of the disclosure, calibration factors of the at least one calibration factor correct for errors measured during testing of respective test points of a series of test points, wherein at least one calibration factor corresponds to each test point. Each test point corresponds to a different current magnitude for modeling non-linearity of errors associated with a range of current magnitudes for current signals of the electrical energy operated on by the at least one external CT, wherein the greater the non-linearity of the errors, the greater the concentration of test points.

In another embodiment of the disclosure a method is provided for measuring electrical energy in a meter. The method includes the step of storing at least one calibration factor for compensating for errors associated with at least one of at least one CT and at least one PT that operates on electrical energy provided to the meter device. The method further includes the step of measuring at least one electrical parameter of electrical energy provided to the meter device. The measuring includes adjusting the measuring for compensating for the errors, including processing the measured at least one electrical parameter using the at least one calibration factor. Calibration factors of the at least one calibration factor correct for errors measured during testing of respective test points of a series of test points, wherein at least one calibration factor corresponds to each test point. Each test point corresponds to a different current magnitude for modeling non-linearity of errors associated with a range of current magnitudes for current signals of the electrical energy operated on by the at least one CT, wherein the greater the non-linearity of the errors, the greater the concentration of test points.

In a further embodiment of the disclosure, a processing device is provided in communication with the meter device, where the meter device measures electrical energy. The processing device includes an input device for receiving input information relating to at least one error, where an error of the at least one error is related to a difference between an input value corresponding to at least one of voltage, current, and phase shift therebetween associated with electrical energy operated on by at least one of at least one external CT and at least one external PT which is provided to the meter device, and a value measured by the meter device which corresponds to the input value. The processing device further includes at least one processor for generating at least one calibration factor, each calibration factor corresponding to an error of the at least one error for adjusting measurement by the meter device in accordance with the errors; and at least one communication device for uploading at least one of the generated calibration factors to the meter device.

Pursuant to another embodiment of the disclosure, the at least one error is determined by performing a test, including measuring energy associated with a series of at least two test points. Each test point of the series corresponds to a different input current value over a range of input current values of the electrical energy operated on by the at least one CT. For each test point of the series of at least two test points there is at least one corresponding calibration factor. Respective calibration factors provide for adjusting measurement by the meter device, including correcting for errors of the at least one error related to the input current values to which the respective test points correspond. The calibration factors corresponding to the respective test points compensate for non-linearity of the at least one error associated with the range of input current values.

In another embodiment of the disclosure, a method is provided for calibrating the meter device for measuring electrical energy. The method includes the step of receiving information relating to at least one error, wherein each error of the at least one error is related to a difference between a respective input value corresponding to at least one of voltage, current, and phase shift therebetween associated with power operated on by at least one of at least one CT and at least one PT which is provided to the meter device, and a value measured by the meter device which corresponds to the input value. The method further includes the steps of generating at least one calibration factor, each calibration factor corresponding to an error of the at least one error for adjusting measurement by the meter device in accordance with the error, and uploading generated calibration factors to the meter device. The at least one error is determined by performing a test, including measuring energy associated with a series of at least two test points. Each test point of the series corresponds to a different input current value over a range of input current values of the electrical energy operated on by the at least one CT. For each test point of the series there is at least one corresponding calibration factor. Respective calibration factors provide for adjusting measurement by the meter device, including correcting for errors of the at least one error related to the input current values to which the respective test points correspond. The calibration factors corresponding to the respective test points compensate for non-linearity of the at least one error associated with the range of input current values.

BRIEF DESCRIPTION OF THE DRAWINGS

Various embodiments of the invention will be described herein below with reference to the figures wherein:

FIGS. 2A-2C shows tables for storing calibration factors for voltage gain, current gain and phase compensation, respectively;

DETAILED DESCRIPTION OF THE PREFERRED EMBODIMENTS

Figure 1:
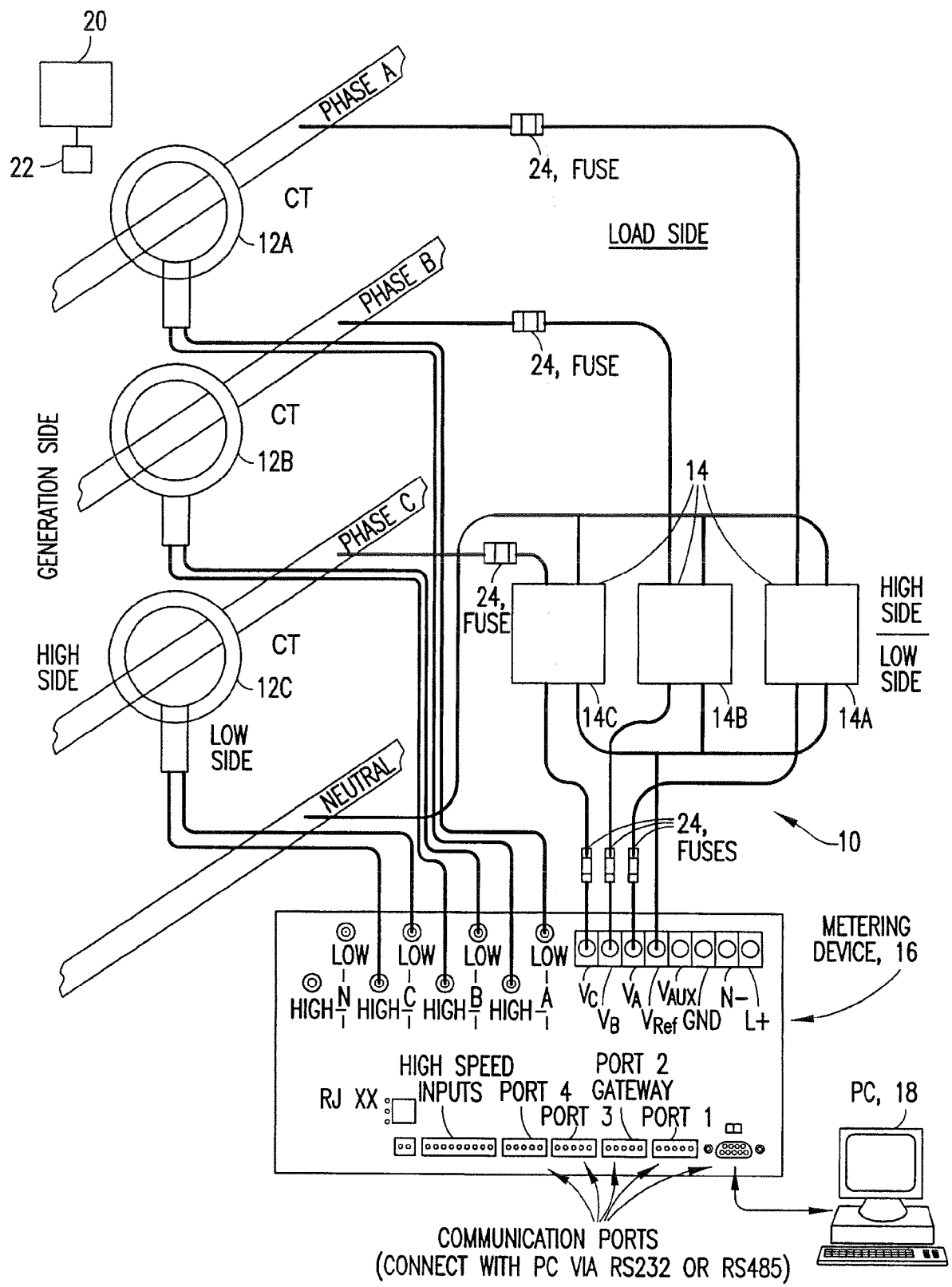
FIG. 1 is a schematic diagram of a power metering system in a power distribution substation in accordance with the present disclosure.

Referring now to the drawings wherein like reference numerals identify similar structural elements, there is illustrated in FIG. 1 a metering system 10 for metering power provided to the system 10 in at least one power line having at least one phase, and typically in three power lines having three respective phases, phases A, B and C. The respective power lines corresponding to phases A, B and C (wherein the power lines are herein referred to as phases A, B and C, respectively) pass through at least one instrument transformer, including current transformers (CTs) 12 and optionally potential (voltage) transformers (PTs) 14, where CTs 12A, 12B and 12C correspond to the phases A, B and C, respectively, and PTs 14A, 14B and 14C correspond to the phases A, B and C, respectively. The signals output by the CTs 12 and the PTs 14 (e.g., when PTs 14 are provided) are provided to an energy meter device 16 which is in wired or wireless communication with a processing device 18. In accordance with the present disclosure, calibration factors for the CTs 12 and PTs 14 are determined and programmed into the meter device 16.

Test equipment 20 is provided for selecting parameters of energy to be provided at the respective phases. The test equipment 20 is operated by a human operator, a processing device and/or a control unit 22 to select a desired parameter of the energy, such as current magnitude, voltage magnitude and/or phase shift. Circuit breaker or fuse devices 24 may be provided along lines input to and/or output from the PTs 14 for providing protection to hardware, such as the PTs 14 and/or the meter device 16. An optional neutral phase and a neutral (e.g., auxiliary) CT 12 may be provided, where the neutral phase is provided as input to the neutral CT 12, and the output is provided as a second input to the respective PTs 14. The output from the PTs 14 which corresponds to the neutral phase may be provided as a voltage reference signal to the meter device 16.

The respective CTs 12 provide control and protection by reducing current flowing through the corresponding power lines for providing a current to the meter device 16 at a level suitable for the meter device 16 which is proportionate to the current flowing through the power line. The CTs 12 further provide electrical isolation of the meter device 16 from the power line. The power line (e.g., phase A, B or C) passes through the respective CT 12 by entering through a primary side (e.g., high side). The CT 12 converts the magnetic field generated in the power line by the current flowing through the power line into a stepped down current reduced in accordance with a predetermined ratio. The reduced line current is output through a secondary side (e.g., low side) of the CT 12 and provided as a current input to the meter device 16.

The respective PTs 14 step voltage of the corresponding power line down to a level which is safe and manageable for the metering device 16. Typically, a respective PT 14 includes a conventional constant-voltage transformer with primary and secondary windings on a common core connected in shunt or parallel to the corresponding power line. The secondary winding insulates the meter device 16 from the power line. The power line is provided to the respective PT 14 at a primary side (e.g., high side), and the stepped down voltage is output from a secondary side (e.g., low side) of the PT 14 and provided as a voltage input to the meter device 16.

The meter device 16 is a meter for calibrating and measuring voltage and current inputs, including compensating for errors associated with the CTs 12 and the PTs 14 in accordance with the present disclosure. The meter device 16 may be used for measuring electricity usage, such as in a substation, at a customer location, or other location where energy measurement is required, e.g., for measuring current, voltage, power and/or usage. A metering device and calibration thereof is described in U.S. Pat. No. 6,735,535, the entire contents of which are expressly incorporated herein in their entirety. The meter device 16 includes a plurality of current input lines 32 for receiving current inputs, e.g., which are the outputs from the CTs 12, and a plurality of voltage input lines 34 for receiving voltage inputs, e.g., which are the outputs from the PTs 14. The meter device 16 includes circuitry for processing the currents and voltages received at the current input lines 32 and the voltage input lines 34, respectively. The circuitry may include for example, at least one amplifying device, sample and hold circuitry, analog to digital converter circuitry, multiplexor device, filter circuitry, processor, (e.g., a digital signal processor (DSP)), storage device (e.g., RAM, ROM, EPROM, flash memory, etc.) or a combination thereof for processing the received inputs and generating a corresponding measured value. Furthermore, various elements of the circuitry may be included together. For example, the storage device may be included with the DSP.

Electrical components of the meter device 16 typically introduce errors (e.g., phase error) into measurements generated by the meter device 16. It is preferable that at the factory a first calibration procedure is performed in which the meter device 16 is operated in a first mode for calibrating the meter device 16 for compensating for errors generated by the meter device 16. When operating in the first mode, errors generated by the meter device 16 are determined, and meter calibration factors are generated which will be used for compensating for errors introduced by the meter device 16 when the meter device 16 operates in a second mode for operation of the meter device 16 for measuring power. The meter calibration factors may be stored in a storage device of the meter device 16, and accessed during operation of the meter device 16. For example, the meter calibration factors may be stored in a meter calibration factor table in a storage device such as an EPROM that is accessible by the processor, e.g., DSP, of the meter device 16.

The meter device 16 may be operated in a third mode in which a second calibration procedure is performed for calibrating the meter device 16 for compensating for errors generated by the CTs 12 and the PTs 14. When operating in the third mode, errors generated by the CTs 12 and PTs 14 are determined, and calibration factors for the CTs and/or PTs are generated which will be used for compensating for errors introduced by the CTs 12 and PTs 14 when the meter device 16 operates in the second mode during operation of the meter device 16 for measuring power. The calibration factors for the CTs and/or PTs (also referred to as CT/PT calibration factors) may be stored in a storage device of the meter device 16, and accessed during operation of the meter device 16. FIGS. 2A-2C shows CT/PT calibration factor tables in which the CT/PT calibration factors may be stored in a storage device such as an EPROM that is accessible by the processor, e.g., DSP, of the meter device 16. Table 202 in FIG. 2A stores voltage gain calibration factors associated with voltage compensation, table 204 in FIG. 2B stores current gain calibration factors associated with current compensation with the current and voltage signals output from the test equipment 20 in phase (or having a unity phase angle), and table 206 in FIG. 2C stores phase calibration factors associated with current compensation with the phase for the current and voltage signals output from the test equipment 20 having a sixty degree shift.

The meter device 16 preferably further includes meter correction tables for storing the meter correction values. The meter device 16 may use the meter correction values when operating in the third mode for calibrating for CT/PT compensation. Furthermore, the meter correction values are preferably used during operation of the meter device 16 in conjunction with the CT/PT tables 202, 204, 206 when operating in the second mode for performing revenue functions.

The meter device 16 is further provided with at least one connector or port 40 providing input/output (I/O) for communicating with other devices, including the processing device 18. Communication may be wireless or wired, such as for connecting to the processing device 18 for using a serial protocol, such as RS232 or RS485. The meter device 16 may further include a display and/or at least one user input device, such as a keypad. During operation of the meter device 16, the processor of the meter device 16 executes a series of programmable instructions which may be stored in the at least one storage device. The mode of operation may be selected, such as via user input and/or by the processing device 18.

The processing device 18, which may be a device such as personal computer or a server, includes at least one input device, such as at least one I/O connector or port and/or user input device, for communicating with the meter device 16, including receiving input information and uploading CT/PT calibration factors to the meter device 16. The input information preferably relates to input values corresponding to the power input by the test equipment 20 into the CTs 12 and/or the PTs 14 and values measured by the meter device 16 corresponding to respective input values. The input information may be received as user input, from the meter device 16, the test equipment 20 and/or another processor or control unit. The processing device 18 further includes at least one processor for executing a series of programmable instructions for at least computing the CT/PT calibration factors in accordance with a difference between respective input values and the corresponding value measured by the meter device 16. The series of programmable instructions can be stored on a computer-readable medium, such as ROM, flash memory, RAM, a hard drive, CD-ROM, smart card, 3.5" diskette, etc., or transmitted via propagated signals for being executed by the at least one processor for performing the functions disclosed herein and to achieve a technical effect in accordance with the invention.

When operating in the third mode, the second calibration procedure is performed for generating and storing in the meter device 16 the calibration factors, including testing at least one test point by operating test equipment 20 to select a known voltage, current and/or phase as the input to a respective CT 12 and/or PT 14, and measuring the output thereof by the meter device 16. The test equipment may be controlled and/or operated by an operator, a control unit 22 and/or processor 18 for automatically or manually stepping through the test points and tests. Preferably, the test equipment is accurate and well calibrated for providing a laboratory test setting. The second calibration procedure is preferably performed when a CT 12 or PT 14 is installed with the meter device 16, such as upon setting up a substation or replacing at least one of the CTs 12, PTs 14 and the meter device 16 at the substation. The mode of operation for the meter device 16 is selected to be the third mode. The measured output is compared to the expected output and a corresponding error value is determined, e.g., the ratio of the difference between the measured value and the expected value with respect to the expected value. The comparison between the measured and expected values and the determination of the error may be performed by an operator, another device (e.g., a remote device) and/or the processing device 18. If not determined by the processing device 18, the error is provided to the processing device 18. The processing device 18 determines adjustments for compensating for the error at the test point, after which the adjustments are written into the appropriate table 202, 204 or 206 of the measuring device 16 as CT/PT calibration factors. The procedure is repeated for testing a series of test points, where the test equipment 20 is operated to adjust one of the selected voltage, current or phase angle for each repetition.

Figure 3A:
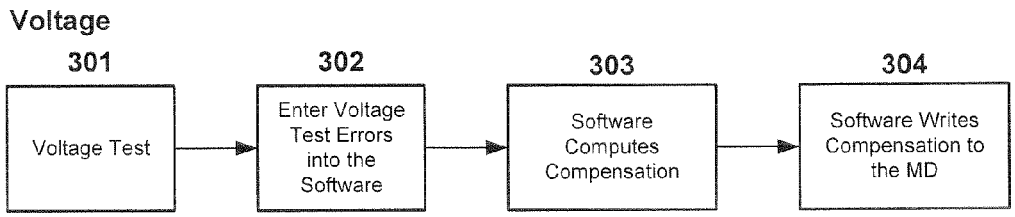
FIG. 3A is a flow diagram of steps performed during voltage calibration of an energy meter device of the power metering system shown in FIG. 1.
Figure 3B:
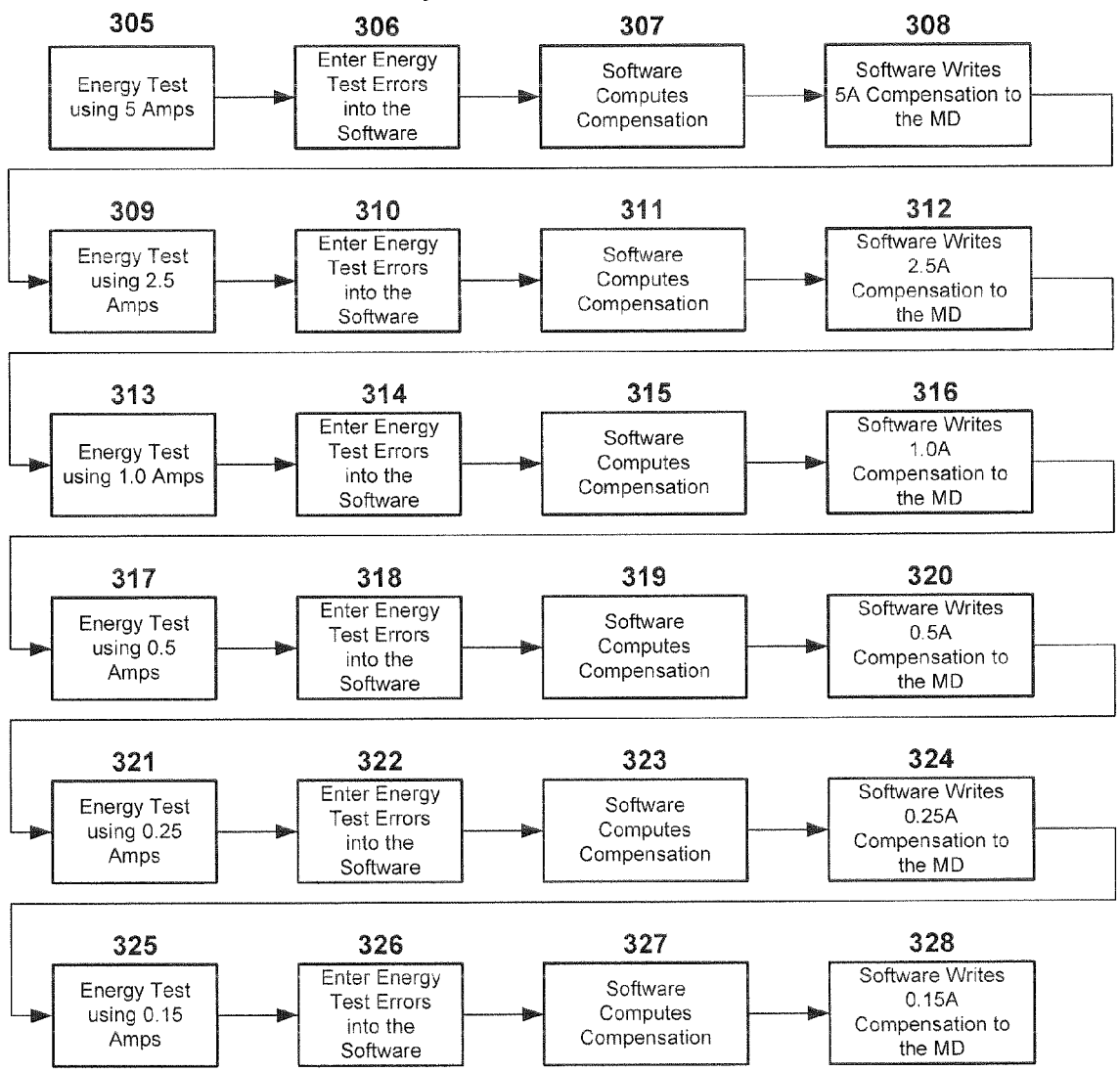
FIG. 3B is a flow diagram of steps performed during current calibration of an energy meter device of the power metering system shown in FIG. 1.
Figure 3C:
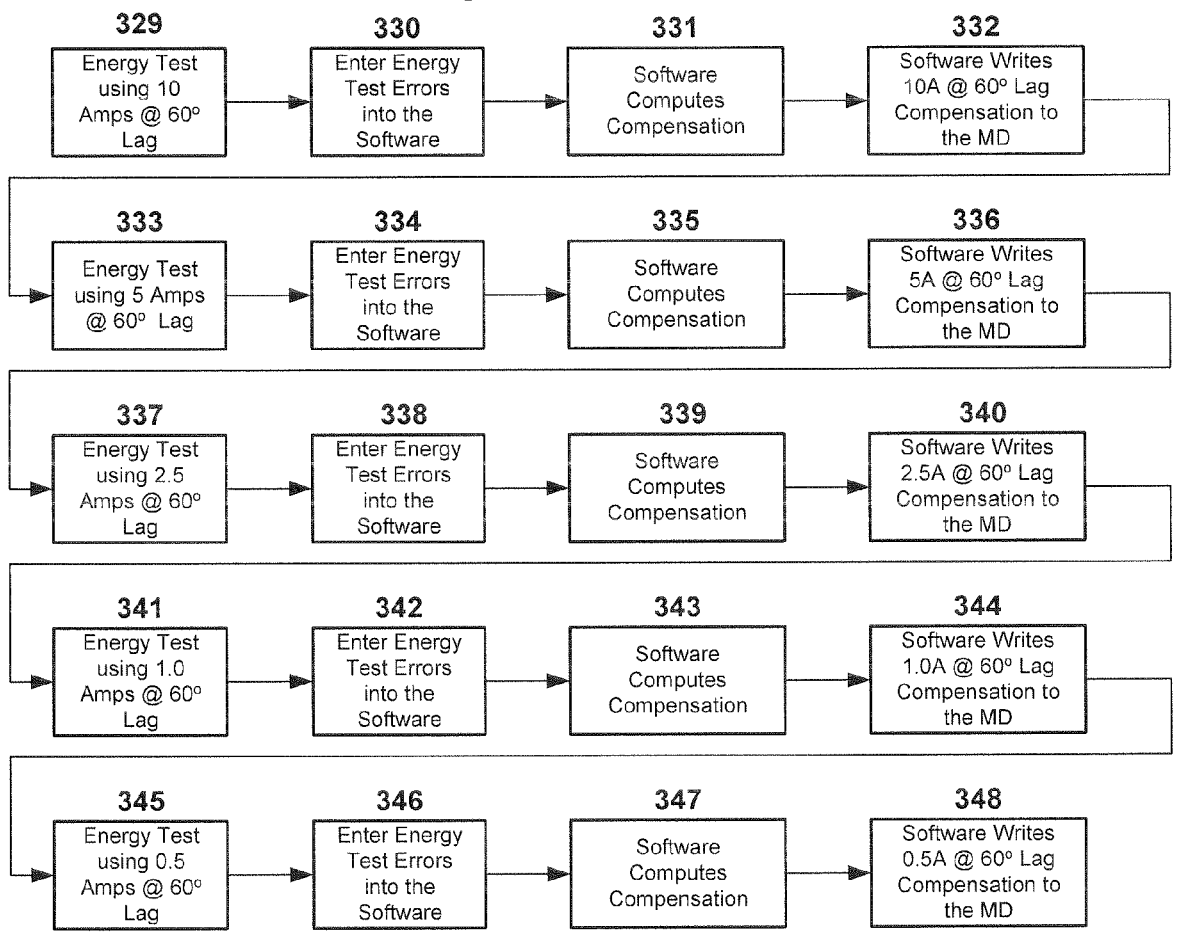
FIG. 3C is a flow diagram of steps performed during phase calibration of an energy meter device of the power metering system shown in FIG. 1.

With respect to FIGS. 3A-3C, an exemplary method is illustrated, in which a second calibration procedure is performed, including a voltage compensation test, followed by a first power (or gain) compensation test with phase angle at unity (e.g., voltage and current signals in phase), followed by a second power (or phase) compensation test with phase to have a selected lag, such as 60 degrees, however the method of the disclosure is not limited to the described order or combination of tests, and a subset of the tests may be used. A user interface is provided with the processing device 18 to facilitate the process of calibrating the meter device 16. Furthermore, the method described uses a direct adjustment interface at the processing device 18 for reading and writing information into the meter device 16, e.g., for reading and modifying registers of the meter device 16.

With reference to FIG. 3A, the voltage compensation test is performed using the corresponding PTs 14, without using the CTs 12. If the PTs 14 are not included, this step may be omitted. The voltage compensation test begins at step 301 by operating the test equipment 20 to provide a selected voltage, preferably 120V, as the input to each of the PTs 14A, 14B and 14C. At step 302, the measured voltage magnitude is compared to the expected voltage magnitude and the error is determined. The error may be determined by the processing device 18 and/or entered into the processing device 18, e.g., entered into a software program executed by the processing device 18. At step 303, the processing device 18 (e.g., a software program executed by the processing device 18) computes the adjustments for performing the compensation in accordance with the determined error and generates corresponding voltage gain calibration factors. At step 304, the voltage gain calibration factors are uploaded from the processing device 18 and written into the meter device (MD) 16 for updating table 202, which may include modifying the appropriate registers. The PTs 14 function linearly and do not generate a substantial phase shift. Accordingly, compensations determined by one test point of the voltage compensation test is typically sufficient for compensating throughout the range of use of the PTs 14.

With respect to FIG. 3B, the first power compensation test is performed using the corresponding CTs 12 and PTs 14 (or only the CTs 12) with phase angle at unity for calibrating the meter device 16 to compensate for magnitude. The first power compensation test starts at step 305 by operating the test equipment 20 at a first test point to provide a selected current, shown in the present example as 5 amps. At step 306, the measured current magnitude is compared to the expected current magnitude, and the error for the first test point is determined by the processing device 18 and/or entered into the processing device 18. At step 307, the processing device 18 computes the adjustments for performing the compensation in accordance with the determined error and generates corresponding current gain calibration factors. At step 308, the current gain calibration factors are uploaded from the processing device 18 and written into the meter device 16 for updating table 204, which may include modifying the appropriate registers. At step 309, the test equipment 20 is operated at a second test point to provide a selected current, where the selected current has been changed relative to the previous test point. In the current example, the selected current for the second test point is decremented relative to the first test point to 2.5 amps. In steps 310-312, the error and current phase calibration factor for compensating for the second test point are computed and uploaded to the meter device 16.

In steps 313-328, compensation at subsequent test points is performed. In the present example, the currents corresponding to subsequent test points are selected to be 1.0 amps, 0.5 amps, 0.25 amps and 0.15 amps, respectively, however the present disclosure is not limited thereto, and other currents may be selected, a different number of test points may be used, the current may be increased or decreased for subsequent test points, the intervals between selected currents for adjacent test points may be larger or smaller than the example shown, etc. The error and current gain correction factors for the respective test points are computed and uploaded to the meter device 16. The multiple test points provide the function of adjusting for non-linearity of the CTs 12 and errors generated by the CTs 12. More particularly, the non-linearity of the CTs 12 is more severe at low levels of current, e.g., for 0-5 amps, after which the CTs 12 operate more linearly. Accordingly, it is preferable to have closely spaced test points for the lower currents for modeling small linear curves in-between the test points.

With reference to FIG. 3C, the second power compensation test is performed using the corresponding CTs 12 and PTs 14 with phase having a sixty degree lag (e.g., a 0.5 power factor (PF) for sinusoidal current and voltage signals) for calibrating the meter device to compensate for phase shift. The second power compensation test starts at step 329 by operating the test equipment 20 at a first test point to provide a selected current, shown in the present example as 10 amps. At step 330, the measured phase angle is compared to the expected phase angle and the error for the first test point is determined by the processing device 18 and/or entered into the processing device 18. At step 331, the processing device 18 computes the adjustments for performing the compensation in accordance with the determined error and generating corresponding phase calibration factors. At step 332, the phase calibration factors are uploaded from the processing device 18 and written into the meter device 16 for updating table 206, which may include modifying the appropriate registers. At step 333, the test equipment 20 is operated at a second test point to provide a selected current, where the selected current has been changed relative to the previous test point. In the current example, the selected current for the second test point is decremented relative to the first test point to 5 amps. In steps 334-336, the error and phase calibration factors for compensating for the second test point are computed and uploaded to the meter device 16.

In steps 337-348, compensation at subsequent test points is performed. In the present example, the currents corresponding to subsequent test points are selected to be 2.5 amps, 1.0 amps and 0.5 amps, respectively, however the present disclosure is not limited thereto, and other currents may be selected as described above. The error and adjustments for compensating for the respective test points are computed and uploaded to the meter device 16. The multiple test points provide the function of adjusting for non-linearity of the CTs 12 and errors generated by the CTs 12, with a higher concentration of test points provided for lower currents, as discussed above.

When operating in the third mode, another method may be employed for performing the second calibration procedure which includes using test parameters to automatically step through a series of test points for determining error and CT/PT calibration factors which correspond to the respective test points. The test parameters may be user entered (e.g., for entering individual parameters), user selected (e.g., for selecting a group of parameters) and/or entered or selected by the processing device 18 and/or another processing device, such as upon detection of a predetermined condition. The test parameters may include an initial value for at least one input value selected from an input voltage, an input current which is in phase with the input voltage and/or an input current at a selected phase shift (e.g., sixty degrees) with respect to the input voltage; a range for each initial value, and an increment (or decrement) factor. The second calibration procedure includes for each initial input value, setting the test equipment to correlate to the input value and testing a test point corresponding to the input value, including computing the error, generating the CT/PT calibration factor and storing the CT/PT calibration factor in the meter device 16. The initial input value is incremented in accordance with the increment (or decrement) factor for generating a new input value until the range has been exhausted. A test point is tested for each input value. The setting of the test equipment 20 may be prompted by the processing device 18 and/or controlled by the processing device 18.

The increment value may be an absolute or relative value. It is also contemplated that instead of using an increment value to determine the next input value for a test point, a series of input values are provided and each test point is tested by selecting an input value from the series of input values, where preferably the input value is selected in a sequential order.

Upon each occurrence that the tables 202, 204 or 206 are modified, it is preferable that an associated time stamp is generated for marking the time and/or date that the modification was made. Preferably, an operator may access the time stamp for determining when a previous modification was made. A checksum procedure may be performed as well for respective modifications for maximizing accuracy.

It is contemplated that uploading may occur after each point is tested or after a group of test points is tested, which may be all of the test points or some of the test points. It is further contemplated that the second calibration procedure or a portion thereof be repeated after CT/PT calibration factors corresponding to all of the test points are uploaded for re-testing test points using the most recently added CT/PT calibration factors.

Once the CT/PT calibration factor tables, shown in FIGS. 2A-2C, include one or more entries they may be used for compensation during operation of the meter device 16. Until then, compensation is not performed or default values (e.g., in which the calibration factors are set to "one") are used for performing compensation without actually correcting or adjusting the values read by the meter.

The voltage gain calibration factors stored in table 202 provide correction to voltage gain of the corresponding phase being read by the meter device 16, and are implemented as divisive factors. During operation of the meter device 16, sampled voltage readings are divided by the voltage gain calibration factor for adjusting the magnitude of the sampled voltage reading. During testing for determining errors corresponding to CTs 12 and PTs 14, if it is determined that the voltage reading is "y" percent below the expected value, then the voltage reading is increased, which is accomplished by decreasing the voltage gain calibration factor (having a default value of one) by multiplying the voltage gain calibration factor by $(100/(100+y))$.

The current gain calibration factors stored in table 204 provide correction to current gain readings of the corresponding phase being read by meter device 16, and are implemented as multiplicative factors. Current gain calibration factors corresponding to several test points are provided. During operation of the meter device 16, sampled current readings are multiplied by the current gain calibration factor for adjusting the magnitude of the sampled current reading. When a current reading falls between two test points, the current gain calibration factor to use for adjusting the current reading is interpolated between the bounding test points. For example, for a current gain reading for Phase A of 1.75 amps, the current gain calibration is calculated by compensating in accordance with the current gain calibration factor associated with the test point 1.0 amps which is stored in field 209 (referred to as comp(field 209)) and the test point 2.5 amps which is stored in field 208 (e.g., comp (field 208)). More particularly, the current gain reading is adjusted by multiplying the current reading by $((0.5*comp(field\ 209))+(0.5*comp(field\ 208)))$. Similarly, when the meter device 16 reads a current gain for Phase A of 1.5 amps, the reading is adjusted by multiplying the current reading by $((0.33*(comp(field\ 208))+(0.67*comp(field\ 207)))$.

During testing for determining errors corresponding to CTs 12 and PTs 14, if it is determined that the current reading is "y" percent lower than the expected value, the current reading is increased, which is accomplished by increasing the current gain calibration factor (having a default value of one) by multiplying the current gain calibration factor by $((100+y)/100)$.

The phase calibration factors stored in table 206 provide correction to phase angle readings of the corresponding phase A, B or C being read by meter device 16. The phase calibration factors are implemented as power factor shifts for adjusting the power factor slightly in order to change the Watt/VA relationship. Phase calibration factors corresponding to several test points are provided. During operation of the meter device 16, sampled power readings are multiplied by the phase calibration factor for adjusting the phase of the sampled power reading. When a current reading falls between two test points, the phase calibration factor to use for adjusting the phase angle of the power reading is interpolated between the bounding test points. During testing for determining errors corresponding to CTs 12 and PTs 14, if it is determined that the power reading is "y" percent below the expected value, then the phase angle (i.e. phase shift) is adjusted, which is accomplished by shifting the phase calibration factor (having a default value of 0 degrees) by an additional $(\cos^{-1}(50/(100+y)))$ degrees.

Advantageously, corrections provided by the calibration factors compensate for non-linearity of errors associated with a range of current magnitudes for current signals of the electrical energy operated on by the at least one CT 12. The errors are related to a difference between an input value corresponding to at least one of voltage, current, and phase shift therebetween associated with electrical energy operated on by the CTs 12 and provided to the meter device, and a value measured by the meter device 16 which corresponds to the input value. Specifically, the phase and voltage calibration factor correct for errors measured during testing of respective test points of a series of test points. Each test point corresponds to a different current value (e.g., magnitude) for modeling non-linearity of errors associated with the CTs 12. The test points are more closely spaced (e.g., concentrated) for current values where the non-linearity of errors generated is expected to be greatest or determined to be greatest during testing.

The described embodiments of the present invention are intended to be illustrative rather than restrictive, and are not intended to represent every embodiment of the present invention. Various modifications and variations can be made without departing from the spirit or scope of the invention as set forth in the following claims both literally and in equivalents recognized in law.

The invention claimed is:

1. A meter device for measuring electrical energy comprising:
   circuitry for measuring at least one parameter of electrical energy monitored by the meter device;
   a storage device for storing at least one calibration factor for compensating for errors associated with at least one of at least one external current transformer (CT) and at least one external potential transformer (PT) that operates on the electrical energy provided to the meter device;

at least one processor for processing the at least one calibration factor for adjusting the measured at least one parameter of electrical energy for compensating for the errors when measuring the at least one parameter of electrical energy; and at least one communication port for receiving the at least one calibration factor from an external device, wherein calibration factors of the at least one calibration factor correct for errors measured during testing of respective test points of a series of test points, each test point corresponding to a different current magnitude for modeling non-linearity of errors associated with a range of current magnitudes for current signals of the electrical energy operated on by the at least one external CT, and at least one calibration factor corresponds to each test point, and wherein at least one calibration factor for the at least one external potential transformer (PT) is determined from one voltage test point.

2. The meter device according to claim 1, wherein the at least one calibration factor is selected from the group consisting of at least one voltage gain calibration factor for compensating for errors associated with the at least one external PT, at least one current gain calibration factor for compensating for errors associated with the at least one external CT when current and voltage signals of the electrical energy operated on by the at least one external CT and the at least one external PT, respectively, are in phase, and at least one phase calibration factor for compensating for errors associated with the at least one external CT with a phase shift of sixty degrees with respect to the current and voltage signals operated on by the at least one external CT and the at least one external PT, respectively.

3. The meter device according to claim 1, wherein the greater the nonlinearity of the errors, the greater the concentration of test points.

4. The meter device according to claim 1, wherein the at least one communication port is further configured for communicating with the at least one processor.

5. A meter device for measuring electrical energy comprising:

circuitry for measuring at least one parameter of electrical energy monitored by the meter device;

a storage device for storing at least one calibration factor for compensating for errors associated with at least one of at least one external current transformer (CT) and at least one external potential transformer (PT) that operates on the electrical energy provided to the meter device;

at least one processor for processing the at least one calibration factor for adjusting the measured at least one parameter of electrical energy for compensating for the errors when measuring the at least one parameter of electrical energy; and at least one communication port for receiving the at least one calibration factor from an external device, wherein calibration factors of the at least one calibration factor correct for errors measured during testing of respective test points of a series of test points, each test point corresponding to a different current magnitude for modeling non-linearity of errors associated with a range of current magnitudes for current signals of the electrical energy operated on by the at least one external CT, and at least one calibration factor corresponds to each test point, and wherein a plurality of phase calibration factors are provided, each phase calibration factor corresponding to a test point of the series of test points, wherein compensating for errors when measuring power of the at least one parameter of electrical energy in which measured current associated with the measured power falls in between two test points includes using a calibration factor related to a calibration factor corresponding to at least one of the two test points.

6. A method for measuring electrical energy in a meter comprising the steps of:

storing at least one calibration factor for compensating for errors associated with at least one of at least one current transformer (CT) and at least one potential transformer (PT) that operates on electrical energy provided to the meter; and measuring at least one electrical parameter of the electrical energy provided to the meter device comprising the step of:

adjusting the measuring for compensating for the errors by processing the measured at least one electrical parameter using the at least one calibration factor;

wherein calibration factors of the at least one calibration factor correct for errors measured during testing of respective test points of a series of test points, each test point corresponding to a different current magnitude for modeling non-linearity of errors associated with a range of current magnitudes for current signals of the electrical energy operated on by the at least one CT, and at least one calibration factor corresponds to each test point, wherein the at least one calibration factor is selected from the group consisting of at least one voltage gain calibration factor for compensating for errors associated with the at least one PT, at least one current gain calibration factor for compensating for errors associated with the at least one CT when current and voltage signals of the electrical energy operated on by the at least one CT and the at least one PT, respectively, are in phase, and at least one phase calibration factor for compensating for errors associated with the at least one CT with a predetermined non-zero phase shift with respect to the current and voltage signals operated on by the at least one CT and the at least one PT, respectively.

7. The method according to claim 6, wherein the greater the non-linearity of errors, the greater the concentration of test points.

8. The method according to claim 6, wherein compensation is performed by at least one of implementing the at least one voltage gain calibration factor as a divisive factor, implementing the at least one current gain calibration factor as a multiplicative factor, and shifting a measured phase angle of the at least one electrical parameter in accordance with the phase calibration factor;

(the predetermined non-zero phase shift)−($\cos^{-1}(50/(100+y))$), where "y" is the difference between the measured phase angle and an expected phase angle, expressed in terms of percentage.

9. A meter device for measuring electrical energy comprising:

circuitry for measuring at least one parameter of electrical energy provided to the meter device;

a storage device for storing at least one calibration factor for compensating for errors associated with at least one of at least one external current transformer (CT) and at least one external potential transformer (PT) that operates on the electrical energy provided to the meter device; and at least one processor for processing the at least one calibration factor for adjusting the measuring for compensating for the errors when measuring the at least one parameter of electrical energy, wherein the at least one calibration factor includes at least one phase calibration factor for compensating for errors associated with the at least one external CT with a predetermined phase shift with respect to current and voltage signals operated on by the at least one external CT and the at least one external PT, respectively, wherein during testing for determining errors corresponding to the at least one external CT and the at least one external PT, if it is determined that a power reading is "y" percent below an expected value, then the phase shift is adjusted by shifting the at least one phase calibration factor (having a default value of 0 degrees) by an additional $(\cos^{-1}(50/(100+y)))$ degrees.

10. The meter device according to claim 9, wherein the at least one calibration factor further includes at least one voltage gain calibration factor for compensating for errors associated with the at least one external PT, and at least one current gain calibration factor for compensating for errors associated with the at least one external CT when current and voltage signals of the electrical energy operated on by the at least one external CT and the at least one external PT, respectively, are in phase.

11. A meter device for measuring electrical energy comprising:

circuitry for measuring at least one parameter of electrical energy provided to the meter device;

a storage device for storing at least one calibration factor for compensating for errors associated with at least one of at least one external current transformer (CT) and at least one external potential transformer (PT) that operates on the electrical energy provided to the meter device; and at least one processor for processing the at least one calibration factor for adjusting the measuring for compensating for the errors when measuring the at least one parameter of electrical energy, wherein the at least one calibration factor includes at least one phase calibration factor for compensating for errors associated with the at least one external CT with a predetermined phase shift with respect to the current and voltage signals operated on by the at least one external CT and the at least one external PT, respectively, wherein the at least one calibration factor further includes at least one voltage gain calibration factor for compensating for errors associated with the at least one external PT, and at least one current gain calibration factor for compensating for errors associated with the at least one external CT when current and voltage signals of the electrical energy operated on by the at least one external CT and the at least one external PT, respectively, are in phase, and wherein calibration factors of the at least one calibration factor correct for errors measured during testing of respective test points of a series of test points, each test point corresponding to a different current magnitude for modeling non-linearity of errors associated with a range of current magnitudes for current signals of the electrical energy operated on by the at least one external CT, and at least one calibration factor.

12. The meter device according to claim 11, wherein the greater the non-linearity of the errors, the greater the concentration of test points, and wherein the non-linearity is greater at current levels less than 5 amps.

13. The meter device according to claim 11, wherein a plurality of current gain calibration factors are provided, each current gain calibration factor corresponding to a test point of the series of test points, wherein compensating for errors when measured current of the at least one parameter of electrical energy falls in between two test points includes using a calibration factor related to a calibration factor corresponding to at least one of the two test points.

14. The meter device according to claim 11, wherein a plurality of phase calibration factors are provided, each phase calibration factor corresponding to a test point of the series of test points, wherein compensating for errors when measuring power of the at least one parameter of electrical energy in which measured current associated with the measured power falls in between two test points includes using a calibration factor related to a calibration factor corresponding to at least one of the two test points.

* * * * *